(12) United States Patent
Guolo et al.

(10) Patent No.: US 10,024,901 B2
(45) Date of Patent: Jul. 17, 2018

(54) TESTING METHOD AND UNIT FOR MICRO ELECTRO-MECHANICAL SYSTEMS

(71) Applicant: OSAI A.S. S.p.A., Turin (IT)

(72) Inventors: Marco Guolo, Parella (IT); Carlo Ferrero, Parella (IT)

(73) Assignee: OSAI A.S. S.P.A., Turin (IT)

( * ) Notice: Subject to any disclaimer, the term of this patent is extended or adjusted under 35 U.S.C. 154(b) by 92 days.

(21) Appl. No.: 15/085,221

(22) Filed: Mar. 30, 2016

(65) Prior Publication Data
US 2016/0291072 A1  Oct. 6, 2016

(30) Foreign Application Priority Data
Mar. 31, 2015  (EP) .................................. 15162009

(51) Int. Cl.
| | | |
|---|---|---|
| G01R 31/36 | (2006.01) | |
| G01R 31/01 | (2006.01) | |
| G01R 31/28 | (2006.01) | |
| B07C 5/34 | (2006.01) | |
| G01R 31/26 | (2014.01) | |
| H01L 21/00 | (2006.01) | |
| G05B 1/00 | (2006.01) | |

(52) U.S. Cl.
CPC ............ G01R 31/01 (2013.01); B07C 5/3412 (2013.01); G01R 31/2601 (2013.01); G01R 31/2893 (2013.01); *G05B 1/00* (2013.01); *H01L 21/00* (2013.01); *H01L 2221/00* (2013.01)

(58) Field of Classification Search
CPC ....... H01L 21/00; H01L 2221/00; G05B 1/00; G05B 2219/00
See application file for complete search history.

(56) References Cited

U.S. PATENT DOCUMENTS

| | | | |
|---|---|---|---|
| 5,615,039 A * | 3/1997 | Henley ................. | G02F 1/0305 359/257 |
| 5,805,472 A | 9/1998 | Fukasawa | |
| 5,865,319 A | 2/1999 | Okuda et al. | |
| 5,895,858 A | 4/1999 | Malone et al. | |
| 2002/0054813 A1 | 5/2002 | Davidov et al. | |
| 2004/0017537 A1* | 1/2004 | Magana ............ | G02F 1/133351 349/187 |
| 2009/0138119 A1* | 5/2009 | Co ............................ | B25J 9/16 700/121 |

(Continued)

OTHER PUBLICATIONS

European Search Report in patent family member EP 15 16 2009 dated Sep. 22, 2015.

*Primary Examiner* — Jermele M Hollington
*Assistant Examiner* — Temilade Rhodes-Vivour
(74) *Attorney, Agent, or Firm* — Greenblum & Bernstein, P.L.C.

(57) ABSTRACT

A testing method for a micro electro-mechanical system is described, comprising the steps of: i) feeding a system to be tested on a first tray; ii) collecting the system from the first tray; and iii) verifying correct operation of the system collected from the first tray; the method further comprises step iv) of acquiring at least one parameter associated with the presence or otherwise of the system on the first tray; and/or with the fact that the system matches or otherwise a correct identification code; and/or with correct or incorrect orientation and/or position of the system on the first tray; step iv) being performed prior to step ii).

9 Claims, 3 Drawing Sheets

(56) References Cited

U.S. PATENT DOCUMENTS

| | | | |
|---|---|---|---|
| 2010/0310151 A1 | 12/2010 | Kikuchi et al. | |
| 2011/0279136 A1* | 11/2011 | Shiozawa | G01R 31/2891 |
| | | | 324/750.23 |
| 2014/0160270 A1* | 6/2014 | Naito | H01L 21/681 |
| | | | 348/87 |
| 2015/0276863 A1* | 10/2015 | Yamashita | G01C 11/00 |
| | | | 324/750.25 |

* cited by examiner

TESTING METHOD AND UNIT FOR MICRO ELECTRO-MECHANICAL SYSTEMS

The present invention concerns a testing method and unit for micro electro-mechanical systems, also known as MEMS.

In particular, the term micro electro-mechanical systems indicates in a non-limiting manner systems having a square or rectangular form with sides ranging from 1 mm to 6 mm and thickness in the order of 1 mm.

BACKGROUND OF THE INVENTION

Testing units for micro electro-mechanical systems are known, essentially comprising:
- a plurality of trays, each of which can be fed with a respective plurality of micro electro-mechanical systems;
- a testing device for the micro electro-mechanical systems, which electrically communicates with the above-mentioned systems and verifies that the systems themselves are able to correctly respond to a plurality of external stimuli, for example correct transmission of the electrical signal, variations in temperature levels, humidity, noise, acceleration and vibration and magnetic fields; and
- a collecting device, which collects the micro electro-mechanical systems from one of the trays and makes them available to the testing unit.

More precisely, each tray comprises a plurality of chambers, for example a few hundred, within which the micro electro-mechanical systems to be tested are housed.

The trays enter the testing unit one after the other, stop, and the collecting device collects the micro electro-mechanical systems from the tray inside the testing unit.

The testing device comprises, in turn, a chamber provided with a plurality of seats, within which the micro electro-mechanical systems are housed and where their respective functions are tested by means of connection to electrical terminals.

Each micro electro-mechanical system further comprises, on its surface, a two-dimensional identification code, which contains numerous first pieces of information and can be associated with further second pieces of information contained in an external database, including the relative batch.

The Applicant has observed that the above-mentioned testing units, although they function correctly, could be improved, in particular as regards the rapidity and optimisation of the testing process.

More precisely, if the micro electro-mechanical systems are not correctly housed in the tray, there is the risk of the systems being positioned incorrectly within the respective seats of the testing device and consequently interrupting operation of the testing unit.

Furthermore, if the micro electro-mechanical systems are not correctly housed in the tray present inside the machine, there is the risk of interaction with the collecting device causing the micro electro-mechanical systems to come off the tray. This would cause non-collection of said systems or the generation of noise and vibration inside the testing unit.

Moreover, it is important to note that the micro electro-mechanical system must be correctly positioned in the seats of the testing device chamber, in order that said systems can be correctly connected to the electrical terminals.

If the micro electro-mechanical system is incorrectly positioned on the tray, it is nevertheless positioned by the collecting device inside the relative seat of the testing device and testing is performed, albeit ineffectively.

Lastly, if the micro electro-mechanical system is not present on the tray, due to an error, the collecting device detects this and collects another system, reducing the efficiency and rapidity of the testing operation.

U.S. Pat. No. 5,805,472 discloses a testing method comprising reading means for reading an identification code of test trays.

U.S. Pat. No. 5,865,319 discloses an automatic test handler.

The need is felt in the sector to optimise operation of the testing unit, in particular in terms of rapidity and optimisation of the testing operations of the micro electro-mechanical systems.

SUMMARY OF THE INVENTION

The object of the present invention is to provide a testing method for a micro electro-mechanical system which simply and inexpensively meets the above-mentioned need.

The above object is achieved by the present invention since it relates to a testing method for a micro electro-mechanical system, as defined in claim 1.

The present invention further relates to a testing unit for a micro electro-mechanical system, as defined in claim 8.

BRIEF DESCRIPTION OF THE DRAWINGS

For a better understanding of the present invention a preferred embodiment is described below, purely by way of non-limiting example and with reference to the accompanying drawings, in which.

DETAILED DESCRIPTION OF THE INVENTION

Figure 1:
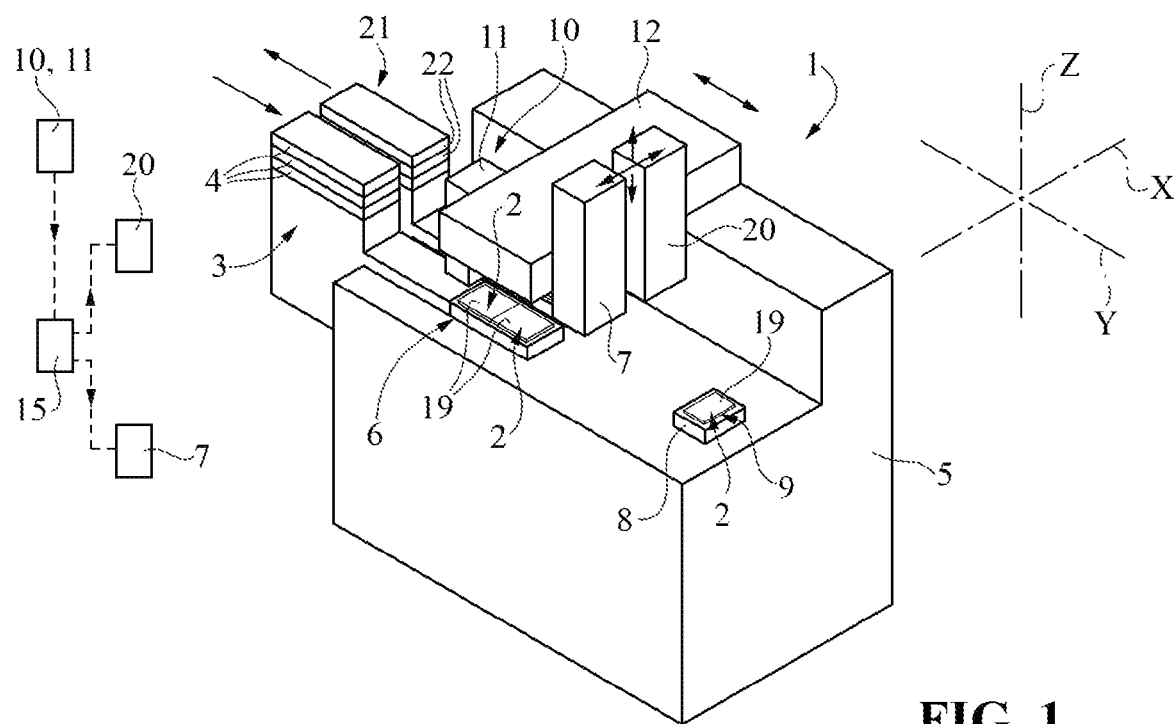
FIGS. 1 to 6 are perspective views of a testing system for micro electro-mechanical systems produced according to the teachings of the present invention and in respective successive steps of a testing method according to the teachings of the present invention.
Figure 2:
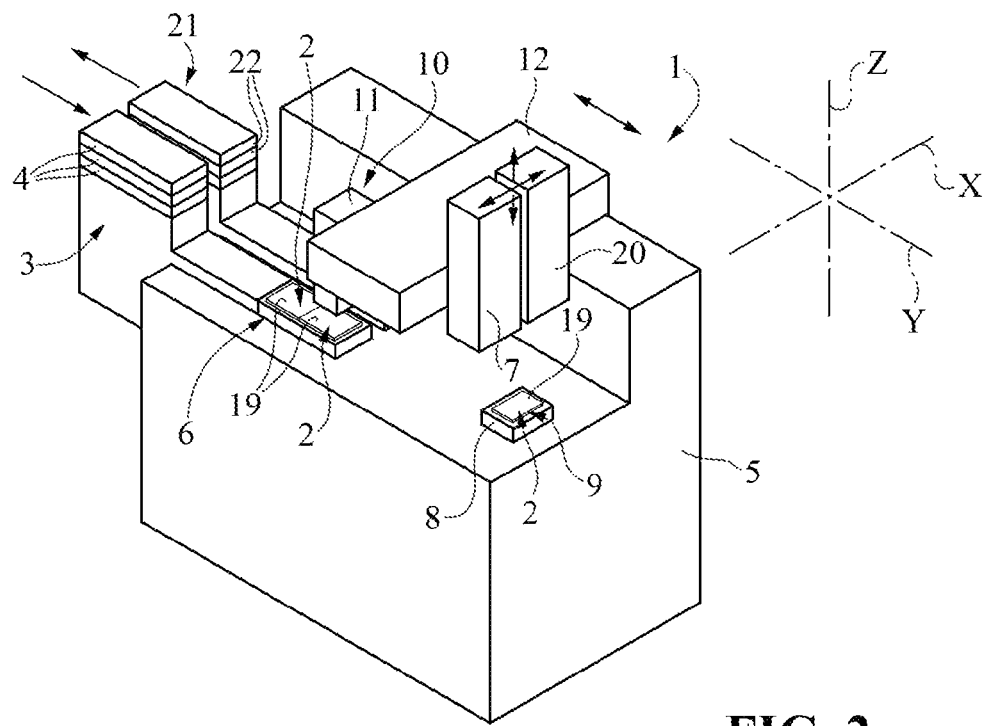
Figure 3:
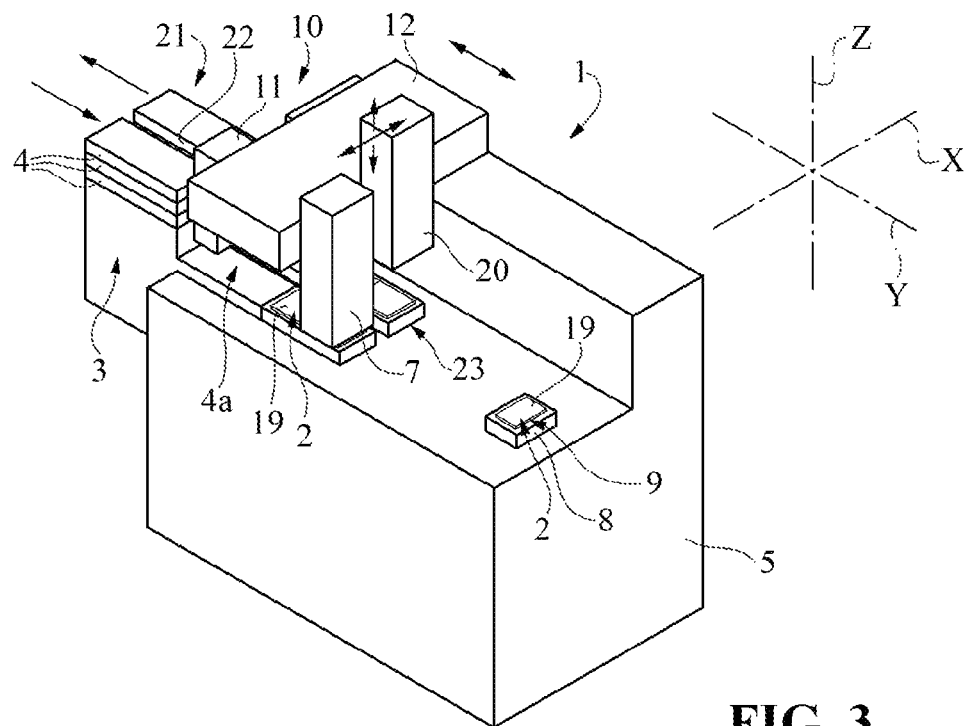
Figure 4:
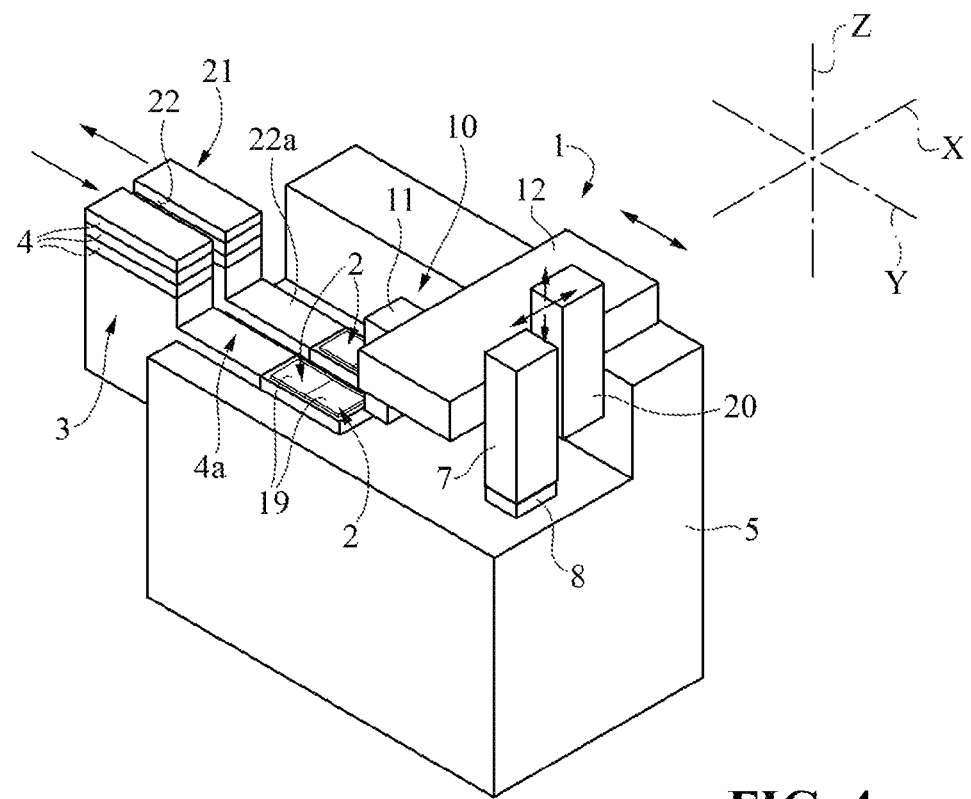
Figure 5:
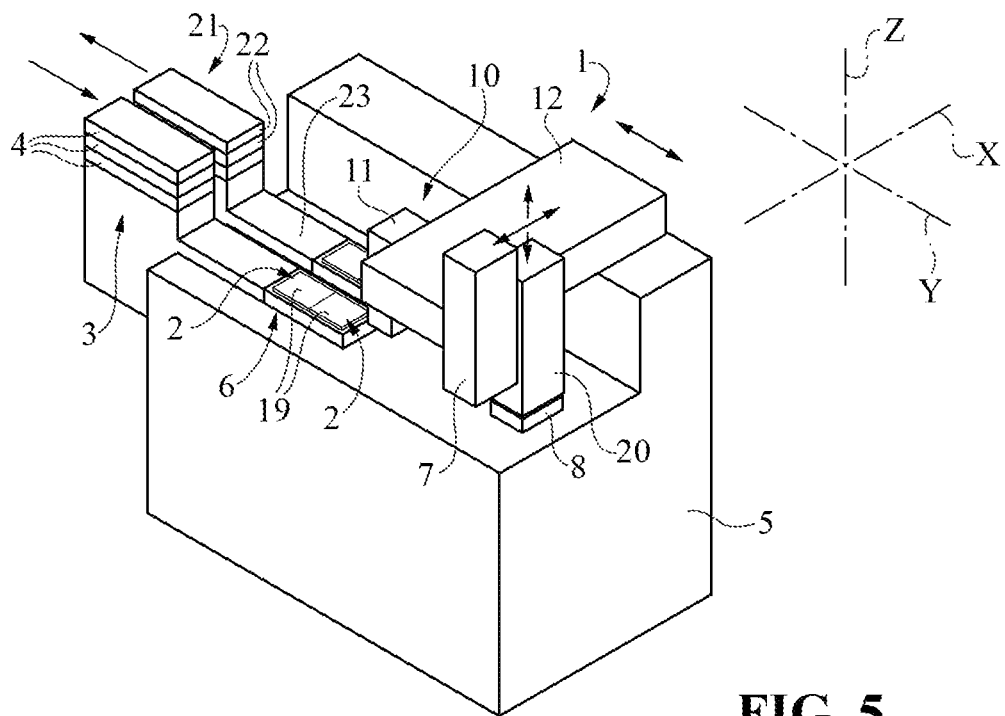

With reference to FIGS. 1 to 6, the number 1 indicates a testing unit for micro electro-mechanical systems 2, also known as MEMS.

In the case illustrated and merely by way of non-limiting example, the systems 2 (only two of which are illustrated in FIGS. 1 to 6) each have a square or rectangular form with sides ranging from 1 mm to 6 mm and thickness in the order of 1 mm.

The systems 2 further comprise respective identification codes, a two-dimensional graphic sign in the case illustrated.

The identification codes contain first pieces of information relative to the systems 2 and furthermore can be associated with further second pieces of information contained in an external database. The first and/or second pieces of information contain, in particular, the batches to which the relative systems 2 belong.

Each system 2 further comprises a sign 19 positioned at one of its vertexes to uniquely identify the orientation of the system 2.

The unit 1 essentially comprises:
- a magazine 3 containing a plurality of trays 4, 4a each loaded with a plurality of systems 2;
- a frame 5;
- a feeding device 6, which collects, one after the other, the trays 4a one at a time from the magazine 3;

a collecting device 7, which is adapted to collect the systems 2 from the tray 4, 4a; and a testing device 8, which comprises a plurality of seats 9 (only one of which is illustrated) for receiving respective systems 2.

The frame 5 supports the feeding device 6, the collecting device 7 and the testing device 8.

More precisely, the trays 4 are stacked on top of one another inside the magazine 3 and access in sequence, one after the other, the unit 1.

The trays 4 are stacked inside the magazine 3 in a direction Z, vertical in the case illustrated.

The testing device 8 is adapted to verify the quality and functionality characteristics of the systems 2.

In particular, the testing device 8 comprises, for each seat 9 and therefore for each system 2 to be tested:

an electrical circuit (not illustrated) for dialoguing with the system 2; and a plurality of sub-devices (not illustrated), which can be activated to expose the system 2 to a plurality of external stimuli, for example variations in temperature levels, humidity, noise, acceleration, vibration and magnetic fields applied.

The feeding device 6 can be fed with the tray 4a arranged at the top within the magazine 3 and moves it in the direction Y on the frame 5.

The trays 4, 4a are also elongated parallel to the direction Y.

The systems 2 to be tested are arranged on the tray 4 in rows (only two of which are illustrated in the attached figures) parallel to the direction X and in columns parallel to the direction Y (only one of which is illustrated in the attached Figures).

The collecting device 7 moves in directions X, Y and Z to position itself at the top and collect the systems 2.

Advantageously, the unit 1 comprises an acquisition device 10, which is configured to acquire at least one parameter associated:

with the presence or otherwise of the systems 2 on the tray 4a; and/or with the fact that the systems 2 to be tested correspond or otherwise to the correct respective identification codes; and/or with the correct or incorrect position/orientation of the systems 2 to be tested on the tray 4a.

In greater detail, the acquisition device 10 acquires an optical parameter.

In the case illustrated, the acquisition device 10 comprises:

two pairs of high-resolution cameras 11 (only one camera 11 of which is indicated in the attached Figures), which acquire an image of the systems 2 arranged on the tray 4a; and a lighting device not illustrated.

Said image contains the sign 19 and, therefore, is also representative of the orientation of the systems 2.

The acquisition device 10 moves in the direction Y and remains at a fixed distance in the direction Z from the tray 4a.

Preferably, the unit 1 supports a support 12 in a movable manner in the direction Y and in a fixed manner in the direction Z.

The support 12 is integral in the direction Y with the acquisition device 10 and with the collecting device 7 and allows movement thereof in the direction Y.

The collecting device 7 is, furthermore, movable in the directions X, Z with respect to the support 12, so as to collect the systems 2 to be tested present on the tray 4a.

More precisely, the tray 4a is stopped inside the unit 1 and the cameras 11 acquire one or more two-dimensional images of the system 2 for a maximum time of three seconds.

More precisely, in order to acquire the entire surface of the tray 4a, the cameras 11 acquire a plurality of images of the system 2, varying the position acquired by means of a movement of the cameras 11 in the direction Y.

The unit 1 further comprises a control unit 15 functionally connected to the camera 11 and to the collecting device 7.

The control unit 15 is programmed to:

identify, on the basis of the image acquired by the camera 11, whether the system 2 should be accepted or discarded or whether it is absent; and generate a control signal for the collecting device 7.

The control signal is generated so that the collecting device 7:

leaves the system 2 on the tray 4a, if the system 2 is to be discarded or is absent; or collects the system 2 from the tray 4a and arranges it in a seat of the testing device 8, if the system 2 is to be tested.

In the case illustrated, the acquisition device 10 is positioned, in direction Y, on the opposite side of the collecting device 7 with respect to the testing device 8.

The unit 1 further comprises:

a collecting device 20, which is adapted to collect the tested systems 2 from the testing device 8;

a magazine 21 containing a plurality of trays 22, 22a overlapping in the direction Z and which have received the tested systems 2 from the collecting device 20; and a feeding device 23, which moves one tray 22a at a time with the tested systems 2 towards the magazine 21.

The collecting device 20 is fixed to the support 12 in the direction Y and is movable with respect to the support 12 in the directions X, Z to arrange the tested systems 2 on the tray 22a.

The tray 22a is moved by the feeding device 23 in the direction Y with respect to the frame 5.

The trays 22, 22a are elongated in the direction Y, lie on a plane defined by the directions X, Y and are arranged horizontally in use.

Below, operation of the unit 1 is described with reference to a group of systems 2 to be tested.

More in particular, operation of the unit 1 is described starting from a condition in which a tray 4a is arranged on the feeding device 6, the systems 2 to be tested are arranged on the tray 4a (FIG. 1) and the tray 22a is arranged on the feeding device 23.

The tray 4a is moved forward by the conveyor 6 in the direction Y towards the testing device 8 and stops.

At this point (FIG. 2), the cameras 11 move in the direction Y, remain at a fixed distance in the direction Z from the tray 4a and scan the system 2.

More specifically, the scanning time is less than 3 seconds.

The cameras 11 acquire an image representing:

the presence or otherwise of the systems 2 on the tray 4; and/or matching or otherwise of the systems 2 to be tested with the correct respective identification codes; and/or the correct or incorrect position/orientation of the system 2 to be tested on the tray 4a.

The cameras 11 furthermore acquire the position of the sign 19, so that the image acquired also represents the orientation of the system 2.

The control unit 15 generates, on the basis of the image acquired by the cameras 11, a control signal for the collecting device 7.

More specifically, if the image acquired detects that the systems 2 should be discarded or are absent, the control signal is such that the collecting device 7 leaves the systems 2 on the tray 4a.

If the image acquired detects that the system 2 is to be tested, the control signal is such that the collecting device moves in the directions X, Z, collects (FIG. 3) the systems 2 from the tray 4a and houses them in the seat 9 of the testing device 8.

Alternatively, the collecting device 7 can perform repositioning of the systems 2 to be tested on the tray 4a before moving them into the seats 9 of the testing device 8.

Once all the systems 2 to be tested have been collected, in one or more operations, by the collecting device 7 from the tray 4a, the latter is returned to the magazine 3.

Simultaneously (FIG. 4), the testing device 8 verifies the quality and functionality characteristics of the system 2 housed in the seat 9.

More specifically, the testing device 8 dialogues by means of electrical connection with the systems 2 to be tested and subjects them, by means of the sub-devices, to a plurality of external stimuli, for example variations in temperature levels, humidity, noise, acceleration and vibration and magnetic field applied.

Figure 6:
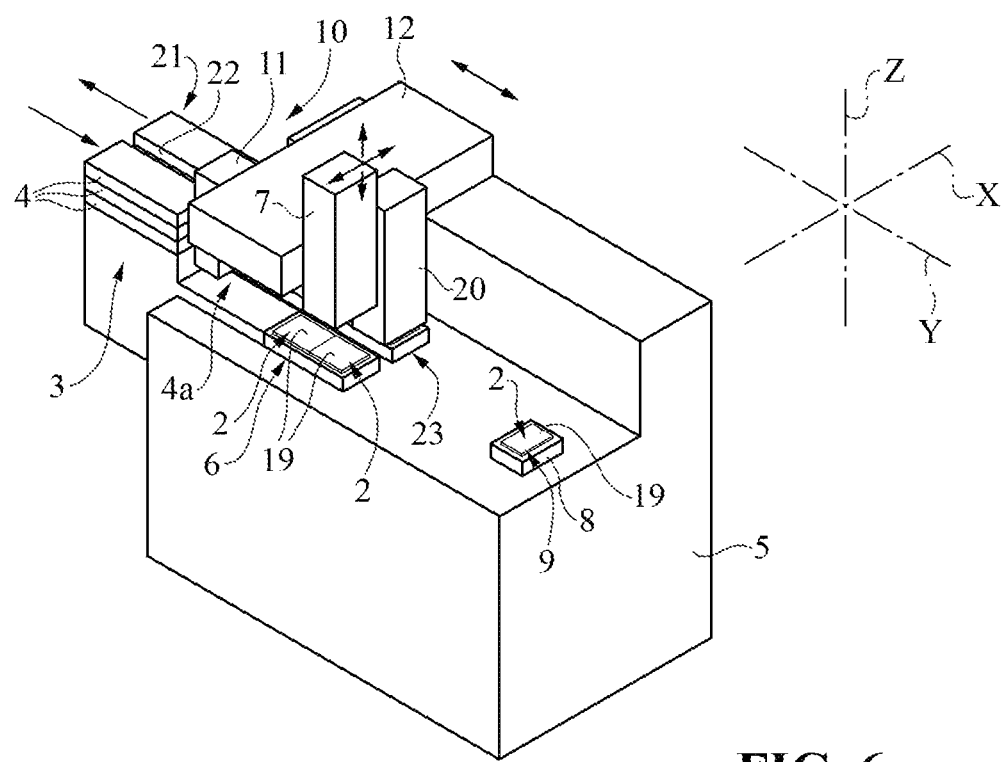

Once the testing has been performed, the collecting device 20 collects (FIG. 5) the tested systems 2 from the seat 9 of the testing device 8 and arranges them on the tray 22a which is positioned at a standstill on the feeding device 23 (FIG. 6).

The tray 22a moves forward in the direction Y on the opposite side of the testing device 8 and reaches the magazine 21.

The magazine 21 contains the tested systems 2, which can be made available at an outlet of the unit 1.

The systems 2 which have not passed the testing in the testing device 8 are collected by the collecting device 20 and conveyed to waste containers not illustrated.

From an examination of the method and the testing unit 1 according to the present invention, the advantages it offers are evident.

In particular, the unit 1 comprises an acquisition device 10, which is configured to acquire a parameter associated with:
the presence or otherwise of the systems 2 on the tray 4a; and/or
matching or otherwise of the systems 2 to be tested with the correct identification code; and/or
correct or incorrect position/orientation of the systems 2 to be tested on the tray 4a.

In this way, the presence of the systems 2 on the tray 4a and/or correct matching of the identification code and/or correct orientation/position on the tray 4a are verified before the collecting device 7 collects the systems 2 and the testing device 8 tests the systems 2.

Consequently, unlike what is described in the introductory part of the present description with reference to the known solutions, the systems 2 to be discarded or not present are not unnecessarily tested by the testing device 8.

This drastically reduces the risk, in the case of incorrect positioning of the systems 2 on the tray 4a, of the collecting device 7 inaccurately positioning the systems 2 inside the respective seats 9 of the testing device 8 and undesired stoppage of the operation of unit 1.

Furthermore, in the event of incorrect positioning of the systems 2 on the tray 4a, there is a reduced risk of the collecting device 7 having to recognise the incorrect positioning or causing the systems 2 to come off the tray 4a with the consequent generation of noise and vibration inside the unit 1, thus reducing the testing efficiency and rapidity of the unit 1.

Moreover, if the systems 2 are not correctly oriented on the tray 4a, the systems 2 are not unnecessarily collected by the collecting device 7 and, therefore, are not tested by the testing device 8.

Lastly, if the image of the identification code acquired by the camera 11 reveals that the relative system 2 does not belong to the correct production batch, the relative system 2 is not collected by the collecting device 7 and, consequently, is not tested by the testing device 8.

The Applicant has observed that as a result of the above-listed advantages, the time necessary to test a given number of systems 2 is substantially reduced compared to the solutions known and described in the introductory part of the present description.

Lastly it is clear that modifications and variations can be made to the unit 1 and the testing method described and illustrated here which do not depart from the protective scope defined by the claims.

In particular, the unit 1 could comprise one single camera 11. In this case, the camera 11 would be movable in both direction Y and direction X.

The invention claimed is:

1. A testing method for a micro electro-mechanical system, comprising
   i) feeding said system to be tested on a first tray;
   ii) collecting said system from said first tray;
   iii) verifying correct operation of said system collected from said first tray; and
   iv) acquiring at least one parameter associated with:
      the presence or otherwise of said system on said first tray; and/or
      the fact that said system matches or otherwise a correct identification code; and/or
      correct or incorrect orientation and/or position of said system on said first tray;
   wherein:
   said process iv) is performed prior to process ii) and comprises process v) of optically scanning said system;
   said process v) comprises process vi) of using at least one camera which acquires an image of said system on said first tray and process vii) of lighting said system on said first tray; and
   said process iv) further comprises:
      viii) identifying on the basis of said parameter whether said system must be discarded or tested;
      ix) leaving said system on said first tray if it has to be discarded; and
      performing process ii) if said system has to be tested.

2. The method according to claim 1, wherein:
   said process ii) comprises process x) of stopping said first tray; and
   said process iv) is performed after said process x).

3. The method according to claim 2, wherein said process x) lasts at the most 3 seconds.

4. The method according to claim 1, wherein said process iv) comprises process xi) of acquiring said parameter in a first direction parallel to a direction of forward movement of said first tray.

5. The method according to claim 4, wherein said process iv) comprises process xii) of maintaining an acquisition device at a fixed distance from said tray measured in a second direction, which is transverse to the first direction.

6. The method according to claim 5, further comprising:
xiii) moving said collecting device and said acquisition device integrally relative to each other in said first direction; and
xiv) moving said collecting device with respect to said acquisition device in said second direction and in a third direction transverse to said first and second direction.

7. A tester for a micro electro-mechanical system comprising:
a first tray, which is adapted to feed said system to be tested into said tester;
an evaluator, which is adapted to test the correct operation of said system;
a first collector, which is adapted to collect said system to be tested from said first tray and make it available to said evaluator;
an acquirer, which is configured to acquire at least one parameter associated with at least one of:
the presence or otherwise of said system to be tested on said first tray; and
the fact that said system to be tested matches or otherwise a correct identification code; and
correct or incorrect position/orientation of said system on said first tray; wherein said acquirer is of an optical type and comprises:
at least one camera, which acquires an image of said system arranged on said first tray; and
a light; and
a controller programmed to identify on the basis of said at least one parameter whether said system must be tested or discarded and to generate a control signal for said collector, said collector alternatively:
leaving said system on said first tray, if said system must be discarded; or
collecting said system to be tested from said first tray and feeding it to said evaluator, if said system to be tested must be tested.

8. The tester according to claim 7, wherein:
said first tray is movable in a first direction;
said acquirer is movable in said first direction; and
said acquirer is positioned at a fixed distance with respect to said first tray in a second direction, which is transverse to said first direction.

9. The tester according to claim 8, wherein:
said collector and said acquirer are movable integrally relative to each other in said first direction; and
said collector is furthermore movable with respect to said acquirer in said second direction and in a third direction transverse to said first and second direction.

* * * * *